United States Patent
Shin et al.

(10) Patent No.: US 7,372,757 B2
(45) Date of Patent: May 13, 2008

(54) MAGNETIC MEMORY DEVICE WITH MOVING MAGNETIC DOMAIN WALLS

(75) Inventors: Sang-Min Shin, Seoul (KR); Yong-Su Kim, Seoul (KR); Yoon-Dong Park, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 51 days.

(21) Appl. No.: 11/523,053

(22) Filed: Sep. 19, 2006

(65) Prior Publication Data

US 2007/0201264 A1  Aug. 30, 2007

(30) Foreign Application Priority Data

Feb. 27, 2006  (KR) .................. 10-2006-0018881

(51) Int. Cl.
- *G11C 11/02* (2006.01)
- *G11C 19/02* (2006.01)
- *G11C 5/06* (2006.01)

(52) U.S. Cl. .............. 365/225.5; 365/80; 365/66; 365/130; 365/243.5; 365/171

(58) Field of Classification Search ............... 365/81, 365/80, 74, 61, 59, 55, 173, 171, 158, 66, 365/243.5, 225.5, 130

See application file for complete search history.

(56) References Cited

U.S. PATENT DOCUMENTS

| 2004/0252538 A1* | 12/2004 | Parkin ......................... 365/80 |
| 2006/0028863 A1* | 2/2006 | Chung et al. ............... 365/158 |
| 2006/0120132 A1* | 6/2006 | Parkin ......................... 365/80 |

* cited by examiner

*Primary Examiner*—J. H. Hur
(74) *Attorney, Agent, or Firm*—Harness, Dickey & Pierce, P.L.C.

(57) ABSTRACT

A magnetic memory device includes a plurality of first metal lines arranged in parallel on a substrate and including a plurality of magnetic domains with variable magnetization directions. A plurality of second metal lines is arranged on the substrate perpendicular to the first metal lines. The plurality of second metal lines each has a tunnel through which the plurality of first metal lines pass. First input units are connected to the plurality of first metal lines and supply a current to drag or move the plurality of magnetic domains. Second input units are connected to the plurality of second metal lines to supply a current for switching the magnetization directions of magnetic domains inside the tunnels. Sensing units are connected to the plurality of second metal lines for sensing an electromotive force caused by magnetic domain walls passing through the tunnels.

20 Claims, 3 Drawing Sheets

MAGNETIC MEMORY DEVICE WITH MOVING MAGNETIC DOMAIN WALLS

PRIORITY STATEMENT

This non-provisional U.S. patent application claims priority under 35 U.S.C. §119 to Korean Patent Application No. 10-2006-0018881, filed on Feb. 27, 2006, in the Korean Intellectual Property Office (KIPO), the entire contents of which is incorporated herein by reference.

BACKGROUND

Description of the Related Art

Related art magnetic memory devices read and write information by detecting resistance changes of magnetic tunneling junction (MTJ) cells. Resistance of the MTJ cells changes according to magnetic polarization directions of two magnetic films with a thin insulating layer there between. For example, the resistance of the MTJ cells may changes according to whether magnetic polarization directions of the two magnetic films are equal or different from each other.

Unless the thin insulating layer is sufficiently clean when the MTJ cells are stacked, a resistance difference distinguishing states, such as, "1" and "0" (e.g., a resistance difference according to the magnetic polarization directions of the upper and lower magnetic films) is negligible. This is because a resistance change rate between a resistance when the MTJ cells are in state "0" and a resistance when the MTJ cells are in state "1" may be limited to about 40% and when the insulating layer is not sufficiently clean, the resistance change rate may be reduced to about 20 to 30%. In this example, information may not be read accurately, which may limit the practical use of memory devices employing MTJ cells.

In addition, because related art magnetic memory devices store only 1-bit information in a single memory area, manufacturing large capacity magnetic memory devices is relatively difficult.

SUMMARY

Example embodiments relate to magnetic memory devices, for example, magnetic memory devices which may read and/or write information using metal lines between which cross points are formed.

Example embodiments provide magnetic memory devices with a structure capable of reading and writing information accurately and/or storing multi-bit information.

According to at least one example embodiment, a magnetic memory device may include a plurality of first metal lines arranged in parallel on a substrate. The plurality of first metal lines may have a plurality of magnetic domains with variable magnetization directions. A plurality of second metal lines may be arranged on the substrate perpendicular or substantially perpendicular to the first metal lines and may include tunnels through which the plurality of first metal lines pass. First input units may be connected to the plurality first metal lines and may supply a current to drag or move the plurality of magnetic domains. Second input units may be connected to the plurality of second metal lines to apply a current for switching the magnetization directions of the plurality of magnetic domains inside the tunnels. Sensing units may be connected to the plurality of second metal lines and may sense an electromotive force caused by magnetic domain walls passing through the tunnels. In at least some example embodiments, the substrate may be a plastic substrate.

According to another example embodiment, a memory device may include a plurality of magnetic memory devices formed on a plurality of substrates stacked on one another. Each magnetic memory device may include may include a plurality of first metal lines arranged in parallel on a substrate. The plurality of first metal lines may have a plurality of magnetic domains with variable magnetization directions. A plurality of second metal lines may be arranged on the substrate perpendicular or substantially perpendicular to the first metal lines and may include tunnels through which the plurality of first metal lines pass. First input units may be connected to the plurality first metal lines and may supply a current to drag or move the plurality of magnetic domains. Second input units may be connected to the plurality of second metal lines to apply a current for switching the magnetization directions of the plurality of magnetic domains inside the tunnels. Sensing units may be connected to the plurality of second metal lines and may sense an electromotive force caused by magnetic domain walls passing through the tunnels. In at least some example embodiments, the substrate may be a plastic substrate.

In at least some example embodiments, the magnetic memory device may further include a plurality of insulating layers interposed between the plurality of first metal lines and the plurality of second metal lines. Each of the plurality of first metal lines may be fin-shaped and/or formed of a ferromagnetic material. In each of the plurality of first metal lines, a single memory area may be formed between adjacent tunnels, wherein a plurality of (e.g., n) magnetic domains may be formed in the single memory area. The single memory area may include a first magnetic domain disposed inside the tunnel. The first magnetic domain may have a reference magnetization direction. When magnetization directions of an (i+1)th magnetic domain and an (i)th magnetic domain are the same, a first data (e.g., information "0") may be recorded, and when magnetization directions of the (i+1)th magnetic domain and the (i)th magnetic domain are different from each other, a second data (e.g., information "1") may be recorded.

In at least some example embodiments, the plurality of magnetic domains corresponding to the memory area and magnetic domain walls between the plurality of magnetic domains may be formed on an end of the first metal line to control dragging or moving of the plurality of magnetic domains within the memory area. A magnetic domain wall stopper for stopping the magnetic domain walls may be formed on the end of each of the plurality of first metal lines. The magnetic domain wall stopper may be a notch formed between the plurality of magnetic domains. The first magnetic domain may be formed inside the tunnel.

A dummy magnetic domain for temporarily changing magnetization direction when information is recorded on other of the plurality of first metal lines may be formed on each of the plurality of first metal lines.

BRIEF DESCRIPTION OF THE DRAWINGS

Example embodiments will become more apparent by describing the attached drawings in which.

DETAILED DESCRIPTION OF EXAMPLE EMBODIMENTS

Figure 1:
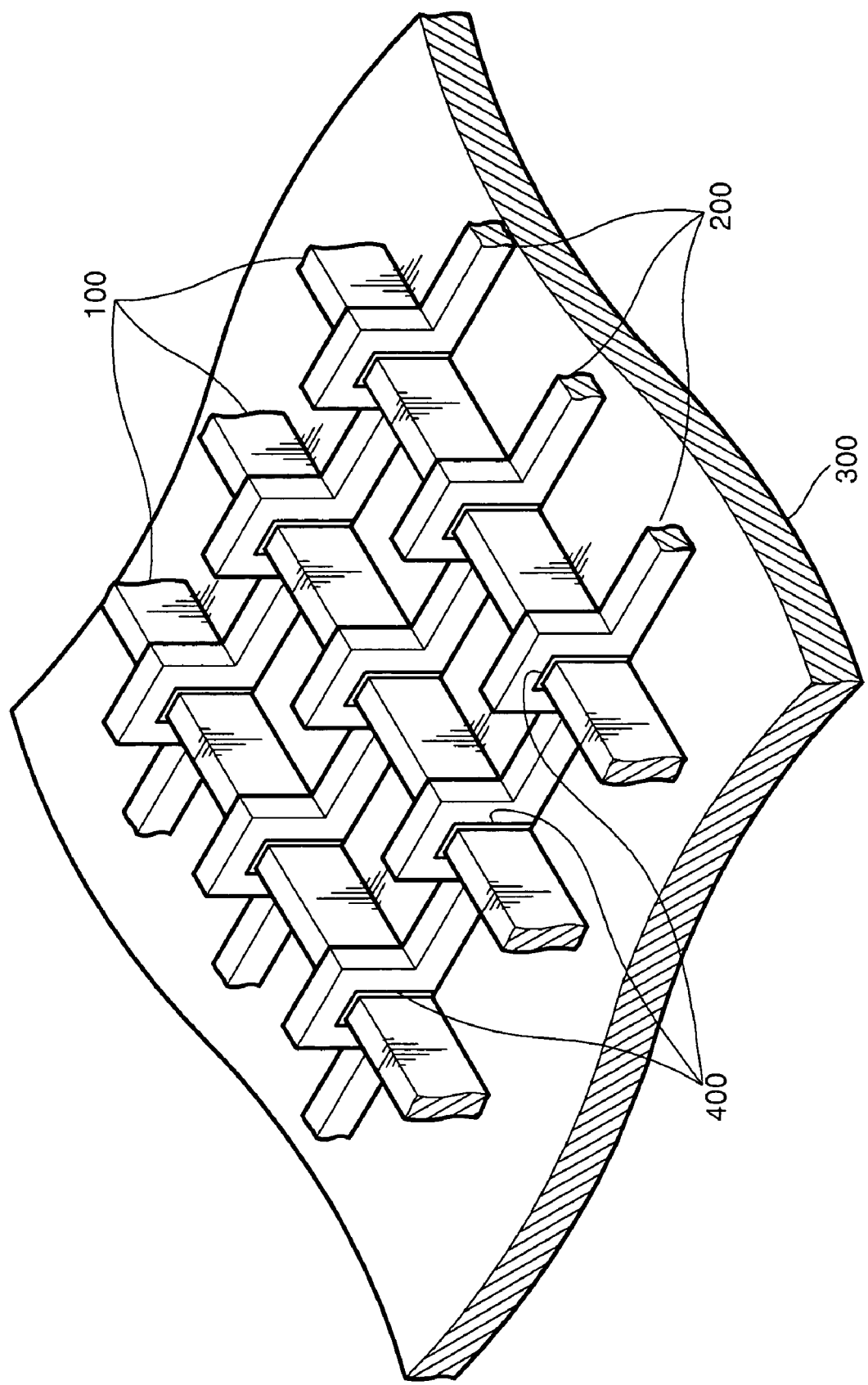
FIG. 1 is a partial perspective view of a magnetic memory device, according to an example embodiment.

Various example embodiments will now be described more fully with reference to the accompanying drawings in which some example embodiments are shown. In the drawings, the thicknesses of layers and regions are exaggerated for clarity.

Detailed illustrative embodiments are disclosed herein. However, specific structural and functional details disclosed herein are merely representative for purposes of describing example embodiments. The present invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a partial perspective view of a magnetic memory device, according to an example embodiment. Referring to FIG. 1, a magnetic memory device may include a plurality of first metal lines 100 and a plurality of second metal lines 200 which may be arranged on a plastic substrate 300 perpendicular or substantially perpendicular to each other. For example, the plurality of second metal lines 200 may orthogonally crossover the plurality of first metal lines 100. The second metal lines 200 may have tunnels corresponding to cross points between the first and second metal lines 100 and 200, and the first metal lines 100 may pass through the tunnels. The magnetic memory device may read information (e.g., single or multi-bit data) by detecting a magnetic flux change at the cross points. In doing so, the magnetic memory device may utilize an electromotive force induced when a magnetic flux is changed by moving a magnet back and forth inside a circular coil. The first metal lines 100 may function as the magnet and the second metal lines 200 may function as the coil.

Because the first metal lines 100 function as the magnet, each of the first metal lines 100 may be formed of a ferromagnetic material such as CoFe, NiFe, or the like and may have a relatively thin fin shape to allow more easy formation and dragging of magnetic domains. In at least one example embodiment, the first metal lines 100 may have a square wave shape.

Each of the second metal lines 200 may be formed of a conductive metal. Insulating layers 400 may be interposed between the first and second metal lines 100 and 200 to suppress (e.g., prevent) a pulse voltage and/or a current applied to the first metal lines 100 from flowing into the second metal lines 200.

Figure 2:
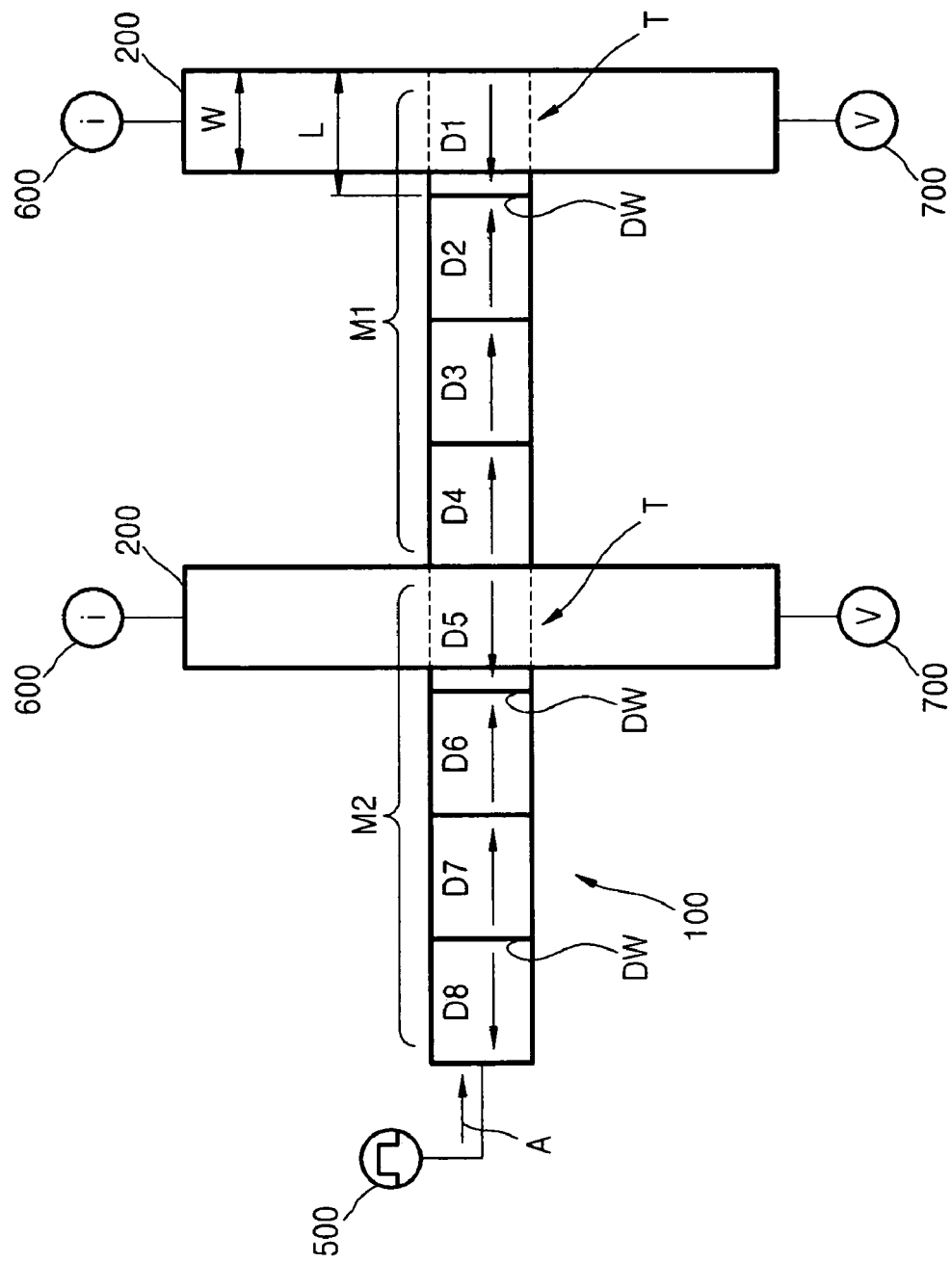
FIG. 2 is a plan view illustrating two memory areas of a magnetic memory device, according to an example embodiment.

FIG. 2 is a plan view illustrating two memory areas of the magnetic memory device, according to an example embodiment.

Referring to FIG. 2, a plurality of (e.g., four) magnetic domains D1 through D4 may be formed in a first memory area M1 and a plurality of (e.g., four) magnetic domains D5 through D8 may be formed in a second memory area M2. The magnetic domains D1 and D5 may serve as reference magnetic domains. The width W of the second metal lines 200 may be less than the length L of the reference magnetic domains of the first metal lines 100. The reference magnetic domains D1 and D5 may be disposed under the tunnels T.

Magnetization directions or polarization of the reference magnetic domains D1 and D5 may be the same. A magnetic domain wall DW may be formed between the domains D1 and D2 whose magnetization directions are different from each other in the first memory area M1. Magnetic domain walls DW may be formed between the magnetic domains D5 and D6 and between the magnetic domains D7 and D8 in the second memory area M2.

First input units 500 may supply a current to the magnetic domains D1 through D8. Second input units 600 may apply a current to the second metal lines 200 to switch the magnetization directions of the magnetic domains under the tunnels. Sensing units 700 (e.g., voltmeters, Ammeters, etc.), may be connected to the second metal lines 200 to sense an electromotive force caused by the change in magnetic flux when the magnetic domain walls DW pass through the tunnels T.

When a positive dragging pulse current is applied to the first metal line 100 through the first input unit 500, the magnetic domains D1 through D8 may move in a direction indicated by an arrow A, and the magnetic domain walls DW pass through the tunnels through the second metal lines 200 such that a magnetic flux changes and an electromotive force in the second metal line 200 is induced.

When the magnetization direction of the magnetic domain D2 is different from the magnetization direction of the reference magnetic domain D1, a magnetic flux in the memory area M1 may change such that an electromotive force is generated. The generated electromotive force may be sensed by sensing unit 700 connected to a second metal line 200 to read first information (e.g., a data bit "1"). When a positive current is again applied to the first metal line 100, because the magnetization direction of the magnetic domain D3 is the same as the magnetization direction of the magnetic domain D2 which becomes a new reference magnetic domain, an electromotive force is not generated, and a second information (e.g., data bit "0") may be read.

Figure 3:
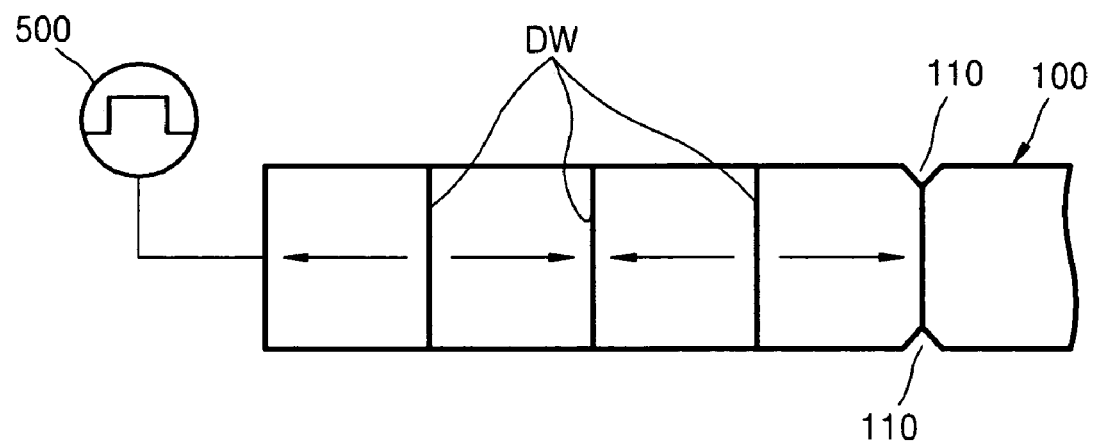
FIG. 3 is a plan view illustrating a method of controlling the dragging of magnetic domains recorded in a memory, according to an example embodiment.

FIG. 3 is a plan view illustrating a method of controlling the dragging of magnetic domains recorded in a memory, according to an example embodiment.

Magnetic domain walls DW may be formed on ends of the first metal lines 100. The number of the magnetic domain walls DW may correspond to the number of information pieces stored in each memory area. For example, a plurality of (e.g., four) magnetic domains may be formed in one memory area in FIG. 2, but information may be stored in only a portion of (e.g., three) magnetic domains. Consequently, for the sake of clarity only a portion of the magnetic domain walls DW are shown in FIG. 3.

Magnetic domain wall stoppers may be formed to stop the respective magnetic domain walls DW. Referring to FIG. 3, a pair of facing notches 110 may serve as the magnetic domain wall stoppers. When a dragging pulse current above a threshold level flows through the first metal line 100 via first input unit 500, the magnetic domain wall DW may pass through the first set of notches 110 and stop at the next set of notches 110. Notches 110 enable each of the magnetic domain walls DW to be dragged or moved a distance corresponding to one magnetic domain.

In a write mode, a positive or negative dragging current may be applied to the first metal lines 100 to locate the magnetic domains of the memory areas under the second metal lines 200. A write current may be applied to the second metal lines 200 to change or switch magnetization directions of the magnetic domains and portions of the memory areas at which the first metal lines 100, receiving the dragging current, and the second metal lines 200, receiving the write current, cross each other may be addressed. Dummy magnetic domains (not shown) may be formed in the first metal lines 100 such that the magnetization directions of magnetic domains of other first metal lines 100, crossing over the second metal lines 200 receiving the write current, may not change. The dummy magnetic domains may be formed on ends of the first metal lines 100 so as not to affect the other magnetic domains.

Magnetic memory devices, according to at least some example embodiments, may be manufactured by creating patterns of the first and second metal lines 100 and 200 on the plastic substrate 300 using, for example, a photolithographic process including at least exposing and etching.

While related art magnetic memory devices using MTJ cells recognize information by detecting a voltage difference, magnetic memory devices, according to at least some example embodiments, recognize information by detecting the existence of an electromotive force. This may improve accuracy in writing and/or reading information.

Because the amount of bit information that may be stored in one memory area corresponds to a number of magnetic domains for data storage formed therein, magnetic memory devices, according to at least some example embodiments, may store multi-bit data or information.

Figure 4:
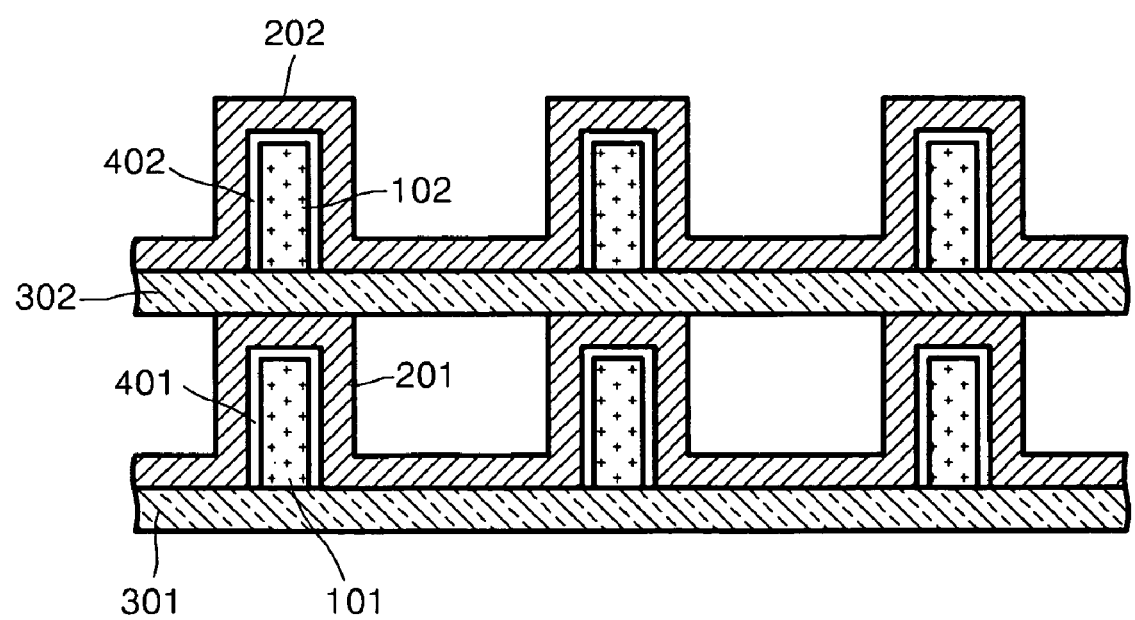
FIG. 4 is a cross-sectional view of a magnetic memory device, according to another example embodiment.

FIG. 4 is a cross-sectional view of a magnetic memory device, according to another example embodiment. The same elements as those in FIG. 1 are designated by the same reference numerals. A detailed explanation of these elements has been omitted for the sake of brevity.

Referring to FIG. 4, a plurality of first metal lines 101 and a plurality of second metal lines 201 may be formed on a first substrate 301. Insulating layers 401 may be interposed between the plurality of first metal lines 101 and the plurality of second metal lines 201. A second substrate 302 may be formed on the second metal lines 201. A plurality of first metal lines 102 and a plurality of second metal lines 202 may be formed on the second substrate 302. Insulating layers 402 may be interposed between the plurality of first metal lines 102 and the plurality of second metal lines 202. The first substrate 301 and the second substrate 302 may be plastic substrates.

Compared to related art magnetic memory devices having MTJ cells using a silicon substrate, magnetic memory devices, according to at least this example embodiment, may increase memory capacity per unit area. For example, silicon substrates of related art magnetic memory devices are grown on a single crystal, which may be affected by impurities. Thus it may be more difficult to grow a second silicon substrate on a first silicon substrate. Because magnetic memory devices, according to at least this example embodiment, form metal lines on a general plastic substrate, a stacked magnetic memory device may be more easily manufactured.

As described above, magnetic memory devices according to at least this example embodiment, may be more easily manufactured and/or more easily stacked to increase memory capacity per unit area because the magnetic memory devices may be manufactured by crossing metal lines on plastic substrates.

Because magnetic memory devices, according to at least some example embodiments, recognize bit information by detecting the existence of an induced electromotive force, reading accuracy may be improved. In addition, because the magnetic memory device may store multi-bit information in a single memory area, magnetic memory devices, according to at least some example embodiments, may have greater storage capacity as compared to related art magnetic memory devices.

While example embodiments have been particularly shown and described with reference to the figures, it will be understood by those of ordinary skill in the art that various changes in form and details may be made therein without departing from the spirit and scope of the present invention as defined by the following claims.

What is claimed is:

1. A magnetic memory device comprising:
   a plurality of first metal lines arranged in parallel on a substrate, each of the plurality of first metal lines including a plurality of magnetic domains with variable magnetization directions;
   a plurality of second metal lines arranged on the substrate, the plurality of second metal lines being arranged perpendicular to the first metal lines and including tunnels through which the plurality of first metal lines pass;
   a plurality of first input units, each first input unit being connected to a corresponding one of the plurality of first metal lines and each of the plurality of first input units supplying a current to move magnetic domains within the corresponding one of the plurality of first metal lines;

a plurality of second input units, each second input unit being connected to a corresponding one of the plurality of second metal lines and each second input unit applying a current to switch magnetization directions of magnetic domains arranged inside the tunnels; and a plurality of sensing units, each of the plurality of sensing units being connected to a corresponding one of the plurality of second metal lines, and sensing an electromotive force caused by magnetic domain walls passing through the tunnels.

2. The magnetic memory device of claim 1, wherein the substrate is a plastic substrate.

3. The magnetic memory device of claim 1, further including, a plurality of insulating layers, each of the plurality of insulating layers being interposed between a corresponding one of the plurality of first metal lines and a corresponding one of the plurality of second metal lines.

4. The magnetic memory device of claim 1, wherein each of the plurality of first metal lines is at least one of fin-shaped and formed of a ferromagnetic material.

5. The magnetic memory device of claim 1, wherein, in each of the plurality of first metal lines, a memory area is formed between adjacent tunnels, the memory area including a plurality of magnetic domains.

6. The magnetic memory device of claim 5, wherein the memory area includes a first magnetic domain having a reference magnetization direction, and wherein when magnetization directions of an (i+1)th magnetic domain and an (i)th magnetic domain are the same, a first data value is recorded, and when magnetization directions of the (i+1)th magnetic domain and the (i)th magnetic domain are different, a second data value is recorded, the first data value and the second data value being different.

7. The magnetic memory device of claim 6, wherein the plurality of magnetic domains formed in the memory area and magnetic domain walls between the plurality of magnetic domains are formed on an end of each of the plurality of first metal lines to control dragging of the magnetic domains, and a magnetic domain wall stopper for stopping the magnetic domain walls is formed on the end of each of the plurality of first metal lines.

8. The magnetic memory device of claim 7, wherein the magnetic domain wall stopper is a notch formed between the magnetic domains.

9. The magnetic memory device of claim 6, wherein the first magnetic domain is formed inside the tunnel.

10. The magnetic memory device of claim 1, wherein a dummy magnetic domain for temporarily changing magnetization direction when information is recorded on other first metal lines is formed on at least one of the plurality of first metal lines.

11. A magnetic memory device comprising:

a plurality of the magnetic memory devices of claim 1 stacked on one another.

12. The magnetic memory device of claim 11, wherein the substrates are plastic substrates.

13. The magnetic memory device of claim 11, further including, a plurality of insulating layers, each of the plurality of insulating layers being interposed between a corresponding one of the plurality of first metal lines and a corresponding one of the plurality of second metal lines.

14. The magnetic memory device of claim 11, wherein each of the plurality of first metal lines is at least one of fin-shaped and formed of a ferromagnetic material.

15. The magnetic memory device of claim 11, wherein, in each of the plurality of first metal lines, a memory area is formed between adjacent tunnels, the memory area including a plurality of magnetic domains.

16. The magnetic memory device of claim 15, wherein the memory area includes a first magnetic domain having a reference magnetization direction, and wherein when magnetization directions of an (i+1)th magnetic domain and an (i)th magnetic domain are the same, a first data value is recorded, and when magnetization directions of the (i+1)th magnetic domain and the (i)th magnetic domain are different, a second data value is recorded, the first data value and the second data value being different.

17. The magnetic memory device of claim 16, wherein the plurality of magnetic domains formed in the memory area and magnetic domain walls between the plurality of magnetic domains are formed on an end of each of the plurality of first metal lines to control dragging of the magnetic domains of the memory area, and a magnetic domain wall stopper for stopping the magnetic domain walls is formed on the end of each of the plurality of first metal lines.

18. The magnetic memory device of claim 17, wherein the magnetic domain wall stopper is a notch formed between the plurality of magnetic domains.

19. The magnetic memory device of claim 16, wherein the first magnetic domain is formed inside the tunnel.

20. The magnetic memory device of claim 11, wherein a dummy magnetic domain for temporarily changing magnetization direction when information is recorded on other first metal lines is formed on at least one of the plurality of first metal lines.

* * * * *